United States Patent
Bahadur et al.

(10) Patent No.: US 7,781,682 B2
(45) Date of Patent: Aug. 24, 2010

(54) METHODS OF FABRICATING MULTICHIP PACKAGES AND STRUCTURES FORMED THEREBY

(75) Inventors: Raj Bahadur, Gilbert, AZ (US); Marcos Valles, Mesa, AZ (US); Matthew J. Graunke, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 12/059,224

(22) Filed: Mar. 31, 2008

(65) Prior Publication Data

US 2009/0244867 A1 Oct. 1, 2009

(51) Int. Cl.
*H01L 23/34* (2006.01)

(52) U.S. Cl. ............... 174/526; 174/521; 257/724; 257/713; 361/705; 361/718

(58) Field of Classification Search ............ 174/526, 174/521; 257/723, 724, 725, 713; 361/705, 361/718

See application file for complete search history.

(56) References Cited

U.S. PATENT DOCUMENTS

| 5,430,611 | A | * | 7/1995 | Patel et al. | 361/705 |
|---|---|---|---|---|---|
| 5,587,882 | A | * | 12/1996 | Patel | 361/705 |
| 6,281,573 | B1 | * | 8/2001 | Atwood et al. | 257/706 |
| 6,373,133 | B1 | * | 4/2002 | DiGiacomo et al. | 257/713 |
| 6,496,373 | B1 | * | 12/2002 | Chung | 361/705 |
| 7,250,675 | B2 | * | 7/2007 | Fasano et al. | 257/723 |
| 7,250,676 | B2 | * | 7/2007 | Wang | 257/723 |
| 7,382,620 | B2 | * | 6/2008 | Khanna et al. | 361/719 |
| 7,423,341 | B2 | * | 9/2008 | Crispell et al. | 257/704 |
| 2002/0079117 | A1 | * | 6/2002 | Coffin et al. | 174/52.1 |
| 2006/0109630 | A1 | * | 5/2006 | Colgan et al. | 361/718 |
| 2009/0057884 | A1 | * | 3/2009 | Too et al. | 257/723 |
| 2009/0219698 | A1 | * | 9/2009 | Chao | 361/718 |

\* cited by examiner

*Primary Examiner*—Hung V Ngo
(74) *Attorney, Agent, or Firm*—Kathy J. Ortiz

(57) ABSTRACT

Methods and associated structures of forming a discontinuous sealant on a substrate, wherein an opening is formed at an integrated heat spreader gap region, wherein the substrate comprises a portion of a multi chip microelectronic package. A thermal interface material is placed on a top surface of a high power die disposed on the substrate, and then an integrated heat spreader lid is placed on top of the sealant and on top of the thermal interface material. A molding compound is flowed within an integrated heat spreader cavity through the opening directly on a top surface of a low power die disposed on the substrate.

9 Claims, 3 Drawing Sheets

METHODS OF FABRICATING MULTICHIP PACKAGES AND STRUCTURES FORMED THEREBY

BACKGROUND OF THE INVENTION

Microelectronic devices are typically assembled into packages that are then mounted onto a substrate, such as a printed circuit board (PCB). For multi chip, central processing unit (CPU) die containing packages, the CPU die may possess higher heat dissipation requirements than other, lower power consuming die that may be present on the substrate, such as memory die, for example. Solder thermal interface material (TIM) may be utilized to attach the dies to an integrated heat spreader (IHS).

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
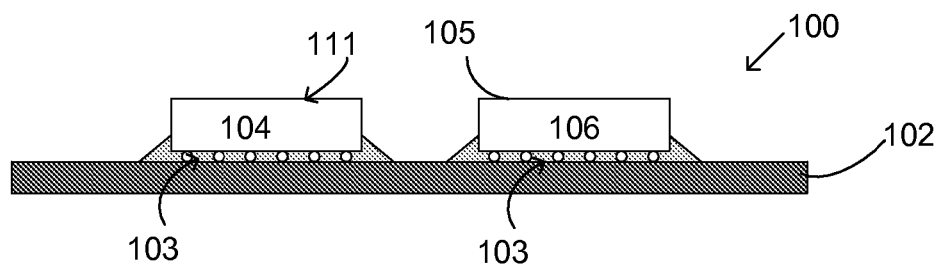
FIGS. 1a-1f represent structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated apparatus of fabricating microelectronic packages are described. Those methods may comprise forming a discontinuous sealant on a substrate, wherein an opening is formed at an integrated heat spreader gap region, wherein the substrate comprises a portion of a multi chip microelectronic package. A solder thermal interface material is then placed on top of a high power die disposed on the substrate, and then an integrated heat spreader lid is placed on top of the sealant and on top of the solder thermal interface material. A molding compound is flowed within an integrated heat spreader cavity directly on a top surface of a low power die disposed on the substrate. Methods and apparatus of the present invention meet chipset heat dissipation requirements, provide increased mechanical strength for the overall package and may enable the use of thinner dies in the package.

FIGS. 1a-1f illustrate an embodiment of a method and associated structures of fabricating a multi chip microelectronic package according to the present invention. FIG. 1a illustrates a portion of a multi chip microelectronic package 100 that may comprise a substrate 102. The substrate 102 may comprise a printed circuit board, for example, or may include any such substrate that electrically connects to microelectronic devices, such as a high power consumption die 104. In one embodiment, the high power die 104 may comprise a CPU die 104, for example. The high power die 104 may comprise a top surface 111.

A low power consumption die 106, that may comprise at least one of a memory die and a chipset die in some embodiments, may be disposed on the substrate 102, adjacent to the high power die 104. The low power die 106 may comprise a top surface 105. In one embodiment the low power die 106 may comprise a Dynamic Random Access Memory (DRAM) die, as is known in the art. It will be understood by those skilled in the art that the high power and low power die 104, 106 may comprise portions of microelectronic packages, such as but not limited to ball grid array (BGA) packages, that may be mounted to the substrate 102 by means of a plurality of interconnect structures 103.

Figure 1B:
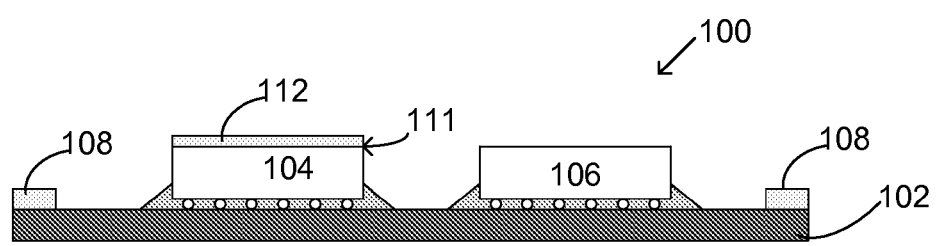
Figure 1C:
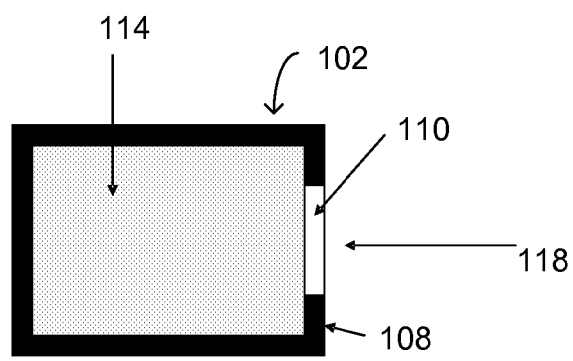

A sealant 108 may be dispensed on the substrate 102 (FIG. 1b). The sealant 108 may comprise any material suitable for sealing a lid, such as an integrated heat spreader (IHS) lid that may be placed onto the substrate 102. In one embodiment, the sealant 108 may be formed on an outer portion of the substrate 102, wherein the sealant 108 may be formed in a discontinuous manner around the outer portion of the substrate 102 (see FIG. 1c, top view). An opening 110 in the sealant 108 coverage around the outer portion of the substrate 102 may be formed. In one embodiment, the opening 110 may correspond to an IHS vent gap region 110 of an IHS.

Figure 1D:
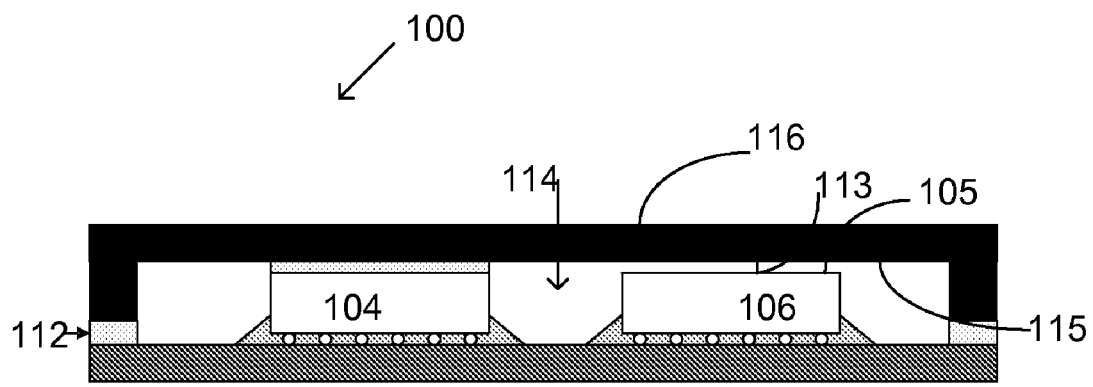

Referring back to FIG. 1b, a thermal interface material (TIM) 112 may be placed on the top surface 111 of the high power die 104. In one embodiment, the TIM 112 may comprise a solder TIM 112, such as an indium containing solder TIM. In one embodiment, the thermal conductivity of the TIM may comprise above about 40 W/m-K. In other embodiments the TIM may comprise a thermal conductivity that is compatible with the heat dissipation requirements of the high power die 104. An IHS lid 116 may be placed on top of the sealant 108 and on top of the TIM 112 disposed on the high power die 104 (FIG. 1d). An IHS cavity 114 may be disposed between the IHS lid 116 and the substrate 102. A gap 113 may be disposed between the top surface 105 of the low power die 106 and a bottom surface 115 of the IHS lid 116. The dimensions of the gap 113 may be optimized depending upon the particular application.

Figure 1E:
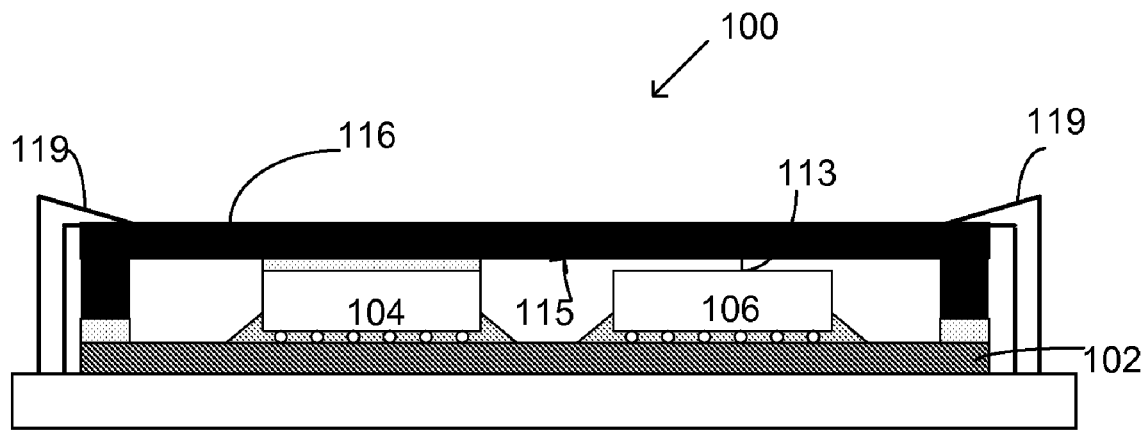
Figure 1F:
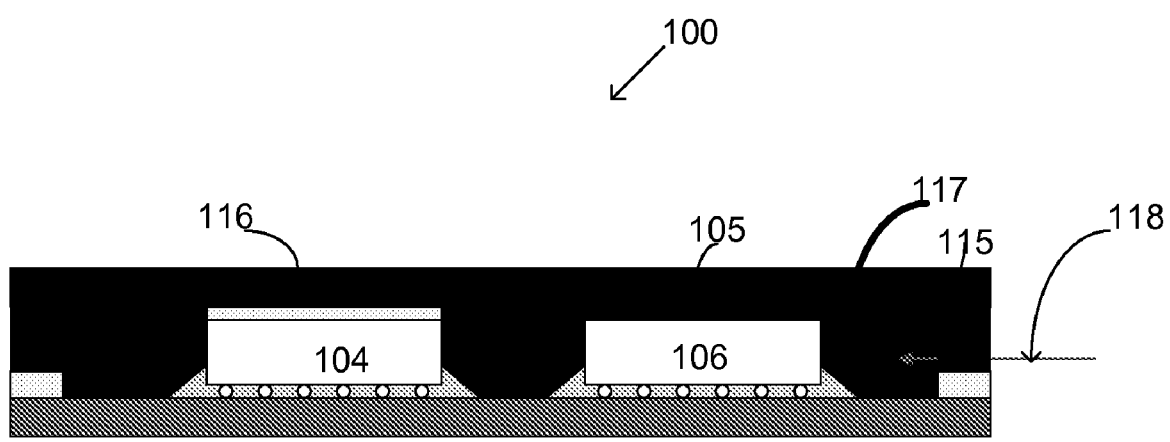

In one embodiment, the multi chip package 100 may be optionally clipped and/or clamped down with clipping/clamping devices 119 in order to clamp down the IHS lid 116 to the substrate (FIG. 1e). A molding compound 117 (FIG. 1f) may be flown 118 through the unsealed IHS gap region 110 (see FIG. 1c, top view) into the IHS cavity 114 that is disposed between the IHS lid 116 and the substrate 102. In one embodiment, the molding compound 117 may comprise any molding type material that comprises a coefficient of thermal expansion (CTE) that may substantially match a CTE of the low power die 104, such as epoxy containing compounds, and/or siloxy containing polymers, for example. In another embodiment, the molding compound 117 may comprise a thermal conductivity of less than about 1 W/m-K. In one embodiment, the molding compound 117 may be flowed 118 (using any suitable molding flow process) within the IHS cavity directly on the top surface 105 of the low power die disposed on the substrate 102. In one embodiment, the molding compound 117 may substantially fill the IHS cavity 114 and may surround the low power and high power dies 106, 104.

The molding compound 117 may serve to attach the top surface 105 of the low power die 106 to the bottom surface 115 of the integrated heat spreader 116, and may fill the gap 115 between the top surface 105 of the low power die 106 to the bottom surface 115 of the integrated heat spreader 116. The molding compound 117 also provides an increased thermal path for heat dissipation from the sides of the high power die 104 and the sides of the low power die(s) 106, which may comprise a set of chipset dies, as are known in the art, in some cases. The molding compound 117 may increase the mechanical strength of the multi chip package 100 and may provide a stiffening benefit because of the filled molding compound material 117 under the IHS 116 and within the IHS cavity 114, which may additionally reduce stress on the TIM 112. The use of thinner dies in the multi chip package 100 are thus enabled. In some embodiments, multiple low power die 106 and high power die 106, such as but not limited to multiple CPU die and multiple DRAM dies, can be molded into the multi chip package 100.

For some multi chip packages 100, the high power die 104 may comprise relatively higher heat dissipation requirements than the low power die 106. In one embodiment, the high power die 104 may require a high thermal conductivity (60 W/m-K or more) solder thermal interface material (TIM) to attach it to the integrated heat spreader 116. Within the same package, adjacent low power die 106 may comprise lower heat dissipation requirements, and therefore do not require solder thermal interface materials. The molding compound 117 meets the low power die 106 heat dissipation requirements. Additionally, the low power die 106 does not require gold metallurgy to connect it to the IHS lid 116, which does not then require gold spot for connection purposes to the low power die 106.

The molding compound 117 provides good interface contact on the low power die to the IHS 116. The bond line thickness of the mold compound 117 on top of the low power die 106 can also be controlled in the mold chase underneath the IHS 116. In some prior art TIM applications, elastomer materials have been used, however the bond line thickness of such elastomer materials are difficult to control due to the influence of curing temperature, and external clip force.

Another problem with elastomer TIM materials is they may exhibit relatively high voiding and poor thermal interface with the IHS and the die to be attached to the IHS. Higher compressive force might be required to reduce the overall voiding at the interface, which increases the mechanical stresses on the dies and the package causing failures. This becomes more problematic as the die thicknesses are reduced in the prior art multi chip packages. The molding compound 117 of the present invention provides good interface contact on the low power die 106 to the IHS 116 as well as controllable bond line thickness of the mold compound 117 on top of the low power die 106.

Further benefits of the various embodiments of the present invention include enabling the fabrication of multi chip packages comprising a molding compound that is used to attach low power memory/chipset dies, for example, to an integrated heat spreader. The molding compounds of the various embodiments meet the same or higher heat dissipation requirements as elastomer materials. The higher heat dissipation is because of better interfacial contacts at the low power die top and IHS sides of the mold compound than when elastomer materials are used, and also from increased thermal paths from the lateral sides of the dies within the multi chip package. The mechanical strength of the multi chip package is increased because of additional support provided by the molding compound.

The CTE of the molding compounds can be closely matched to a silicon die CTE values (about 2-5 ppm/K). Another advantage of the embodiments of the invention is the avoidance of the use of costly solder TIM materials for attaching the integrated heat spreader to both the high power die and the low power die, as well as eliminating the need for the back side metallization of the low power die and gold spot size on the IHS, which reduces the package cost.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a package, such as may be found in a printed circuit board, is well known in the art. Therefore, it is appreciated that the Figures provided herein illustrate only portions of an exemplary package assembly that pertains to the practice of the present invention. Thus the present invention is not limited to the structures described herein.

What is claimed is:

1. A structure comprising:
   a TIM disposed on top of a high power die disposed on a substrate;
   an IHS lid disposed on top of a sealant disposed on the substrate and wherein the IHS lid is disposed on top of the TIM; and
   a molding compound within an IHS cavity directly disposed on a top surface of a low power die that is disposed on the substrate.

2. The structure of claim 1 wherein a CTE of the molding compound is closely matched to a CTE of the low power die.

3. The structure of claim 1 wherein a top surface of the low power die and a bottom surface of the IHS lid do not comprise a gold metallurgy connection.

4. The structure of claim 1 wherein the low power die comprises at least one of a memory die and a chipset die, and wherein the high power die comprises a CPU die.

5. The structure of claim 1 wherein the TIM comprises a solder containing thermal interface material.

6. The structure of claim 1 wherein the low power die does not comprise a solder containing thermal interface material, and wherein the molding compound attaches the low power die to the IHS.

7. The structure of claim 1 wherein the substrate comprises a portion of a multichip microelectronic package.

8. The structure of claim 1 wherein the molding compound comprises a thermal conductivity of less than about 1 W/m-K.

9. The structure of claim 7 wherein the sealant is discontinuous around an IHS gap region of the substrate.

* * * * *